United States Patent [19]

Derewonko et al.

[11] Patent Number: 4,596,966
[45] Date of Patent: Jun. 24, 1986

[54] VARIABLE CAPACITOR-CONTROLLED TRANSISTORIZED ULTRA-HIGH FREQUENCY OSCILLATOR

[75] Inventors: Henri Derewonko, Les Ulis; Guy Bessonneau, Marny les Hameaux; Marc Camiade, Bagneux; Alain Bert, Gif sur Yvette, all of France

[73] Assignee: Thomson-CSF, Paris, France

[21] Appl. No.: 708,640

[22] Filed: Mar. 6, 1985

[30] Foreign Application Priority Data

Mar. 9, 1984 [FR] France ................................ 84 03638

[51] Int. Cl.⁴ .............................................. H03B 5/12
[52] U.S. Cl. ................................ 331/68; 331/117 FE; 331/177 V
[58] Field of Search ........ 331/68, 96, 117 R, 117 FE, 331/117 D, 177 V

[56] References Cited

U.S. PATENT DOCUMENTS 3,421,111 1/1969 Boyajian ........................ 331/117 FE
3,775,698 11/1973 Nugent et al. .............. 331/177 V X
4,485,355 11/1984 Scott .......................... 331/117 D X Primary Examiner—Siegfried H. Grimm
Attorney, Agent, or Firm—Oblon, Fisher, Spivak, McClelland & Maier

[57] ABSTRACT

The invention relates to an ultra-high frequency oscillator operating in the X band. The oscillator circuit comprises a common gate-connected field effect transistor. The source connected tuning circuit comprises a variable capacitor of the varactor type controlled by a voltage and a choke in parallel. The control voltage is decoupled from earth by a capacitor. According to the invention, the transistor, the varactor and the capacitor are integrated into the same box or case in the form of a micromodule. The capacitor acts as a base for the transistor and the varactor, which are welded in juxtaposed manner. The length of the connection between the varactor and the source of the transistor has a minimum value, which makes it possible to broaden the linear frequency band as a function of the control voltage.

4 Claims, 5 Drawing Figures

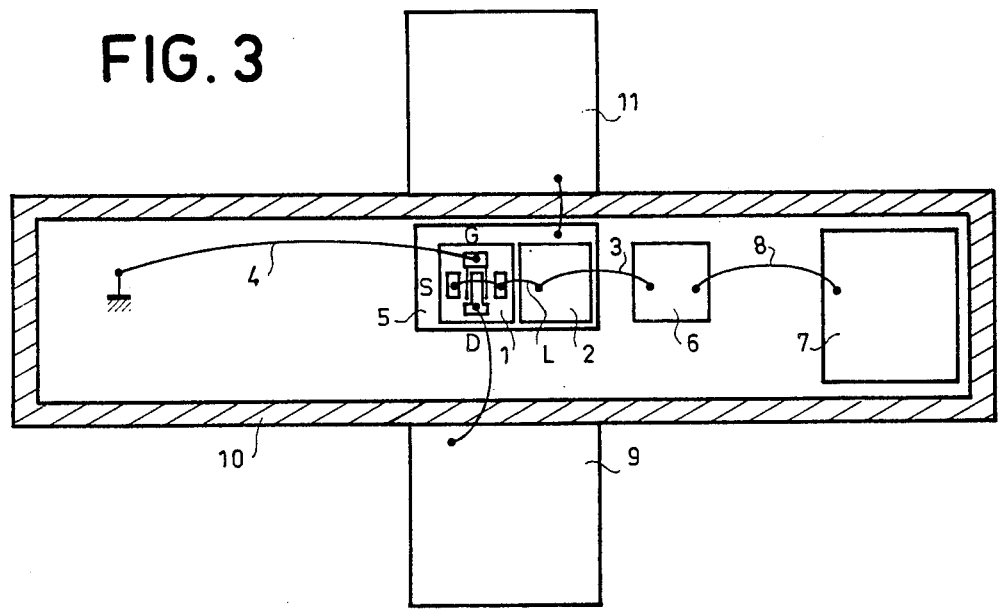
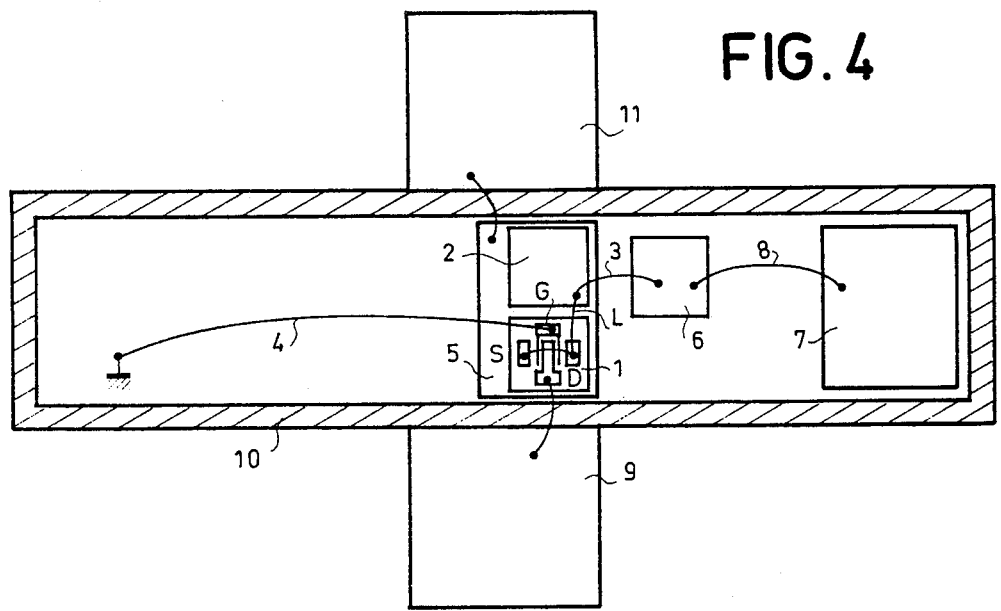

VARIABLE CAPACITOR-CONTROLLED TRANSISTORIZED ULTRA-HIGH FREQUENCY OSCILLATOR

BACKGROUND OF THE INVENTION

The present invention relates to the construction of a field effect transistor oscillator frequency controlled by a d.c. voltage. The invention applies to all types of oscillators based on a field effect transistor, but is more particularly advantageous in the ultra-high frequency range, e.g. in the X band, in which are used GaAs transistors or more generally transistors made from materials of types III–V. At these frequencies, the length of the connections between the oscillator components contribute to a significant modification of the frequency. The structure adopted for the oscillator according to the invention makes it possible to stabilize the oscillator output power with a good frequency linearity in an approximately 1 GHz band, which constitutes a narrow band, but which is still broader than that of e.g. diode oscillators.

In the present state of the art, oscillators operating in the X band, i.e. 5.2 to 11 GHz are constructed in hybrid circuit form, i.e. by the connection on a substrate or in a box or case of discrete components, which are interconnected by metallizations on the substrate or by metal wires in air. At these frequencies, the length of the wires is by no means unimportant and as a result of the reactance thereof can modify the frequency of the oscillator.

Moreover, the known oscillators are often based on a Gunn effect diode and a varactor, i.e. a voltage-controlled, high power variable capacitor. They suffer from the disadvantage of a poor ultra-high frequency efficiency of only roughly 3% and are only linear in frequency as a function of the control voltage in a very narrow band of approximately 300 MHz. The lack of output linearity makes it necessary, if a broad band is required, to use several oscillators in parallel and/or discriminators which lead to supplementary insertion losses in an apparatus not having a high efficiency.

SUMMARY OF THE INVENTION

The oscillator according to the invention uses a field effect transistor controlled by a variable capacitor or varactor, i.e. a low power variable capacitor. At the frequencies in question, the transistor is preferably made from type III–V materials, such as GaAs and the silicon or GaAs variable capacitor is hyper-abrupt. The ultra-high frequency efficiency of this oscillator reaches 20 to 30%, i.e. it is 10 times better than that of a Gunn diode oscillator and its tuning circuit gives it a good linearity in frequency and in power in a band of approximately 1 GHz.

The problem of the length of the connections is solved according to the invention by arranging the pellets of the transistor, the varactor and at least one tuning capacitor in the form of a stack within a box or case provided for a transistor. The connections are ensured by the direct contact between the pellets or, in the case of those juxtaposed, by minimum lengths of metal wires, particularly for the case inlet/outlet. A second tuning capacitor is arranged within the case at a variable distance, so that the length of the connecting wire makes it possible to partly regulate the oscillator frequency. The latter is essentially controlled by the control voltage of the varactor, which also serves as the bias of the transistor.

More specifically, the present invention relates to a transistorized ultra-high frequency oscillator controlled by a variable capacitor of the varactor type, having a field effect transistor, whose gate is earthed through a choke and whose source is connected to a tuning circuit constituted by a varactor in parallel with a tuning choke, the oscillating circuit also having a first capacitor, connected between the varactor and earth in order to insulate from earth the control voltage applied to the varactor and, connected between the tuning choke and earth, a self-biasing circuit formed by a resistor balanced by a second capacitor, wherein the transistor, the varactor and the first capacitor are integrated into the same ultra-high frequency case in the form of a micromodule, the pellet of the transistor and the pellet of the varactor being fixed in juxtaposed manner to the pellet of the first capacitor.

BRIEF DESCRIPTION OF THE DRAWINGS

The invention is described in greater detail hereinafter relative to an ultra-high frequency oscillator and with reference to the attached drawings, wherein:

FIG. 3 shows a diagram illustrating the fitting of the oscillator components into a case according to a first embodiment.

FIG. 4 shows a diagram relating to the fitting of the oscillator components into a case according to a variant of the invention.

DETAILED DESCRIPTION OF THE PREFERRED EMBODIMENTS

Figure 1:
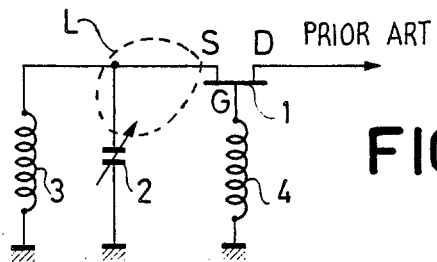
FIG. 1 shows a prior art field effect transistor oscillating circuit.

FIG. 1 shows a diagram of a field effect transistor oscillator according to the prior art. This diagram is highly simplified and e.g. the bias voltages are not shown. In this oscillator, the field effect transistor 1 is connected in common gate manner, the choke 4 by which its gate is earthed is only the connecting wire for connecting the gate on the transistor pellet to the circuit earth, said wire having an inductance of approximately 2 nH. The tuned circuit is constituted by a varactor 2 or variable capacitance diode in parallel with a choke 3, connected to the source of transistor 1. The varactor has an average capacitance of approximately 0.8 pF and the choke 3 an inductance of approximately 2 nH.

The difficult point in such an oscillator is that of the length L of the connection between varactor 2 and the source of transistor 1. Knowing that the chokes 3 and 4, each of 2 nH, are produced by wires of length 2 mm, the connection of length L must be as short as possible, otherwise there is a reduction in the width of the band in which the oscillator has a linear response. Thus, for an oscillator constructed by fixing the components in juxtaposed manner to a substrate, i.e. with a significant connection length L, the linearity as a function of the control voltage is limited to 300 MHz. In order to increase the width of the linearity band, an integrated circuit in which are stored several control voltages is associated with the oscillator.

Figure 2:
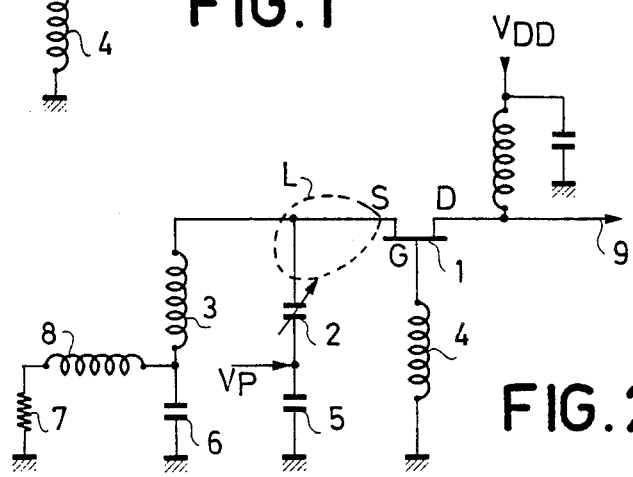
FIG. 2 shows the oscillating circuit used in the oscillator according to the invention.

FIG. 2 shows the oscillating circuit used in the oscillator according to the invention and makes it possible to identify the components of FIGS. 3 and 4.

The basic diagram of the preceding drawing is encountered again in that of FIG. 2. The gate of field effect transistor 1 is earthed by a wire forming a choke 4 and a tuned circuit, constituted by a varactor 2 and a choke 3 is connected to the source of transistor 1. A capacitor 5, with a value of 45 pF fitted between varactor 2 and earth, makes it possible to insulate from the varactor the d.c. bias voltage $V_p$. The application of the bias voltage $V_p$ between varactor 2 and earth rather than between varicap 2 and the source of transistor 1 makes it possible to eliminate a balancing capacitor between the varactor and the transistor and consequently makes it possible to reduce the connection length L. Another capacitor 6, also of 45 pF, is connected between the end of the tuning choke 3 and earth and from the ultra-high frequency standpoint, choke 3 is virtually at earth. However, capacitor 6 balances a resistor 7 having a value of 50 Ohms added for the self-biasing of transistor 1 and so that there is only a single oscillator supply voltage, namely the bias $V_p$. Choke 8 represents the wire connection between the balancing capacitor 6 and resistor 7. As choke 3 is virtually earthed at ultra-high frequencies by capacitor 6, the length of the wire and of choke 8 has no great significance for the oscillator.

The output signal is collected on an external connection 9 on the drain of transistor 1. In conventional manner, the drain is also supplied by a voltage $V_{DD}$ balanced by a choke and an earthed capacitor. The biasing circuit of the drain can be outside the box encapsulating the oscillator.

FIG. 3 shows a first example of the fitting of the oscillator according to the invention. This oscillator is produced in a ceramic - metal rectangular box or case of a well known type for discrete ultra-high frequency transistors. The base of this case is metallic and constitutes the earth plane. The transistor or, in the present case, the oscillator is contained in a ceramic cavity, whereof only the inner contour 10 is shown. Two metal tongues pass through the side walls of ceramic cavity 10 and with the box base constitute the external connections of the oscillator, a first tongue 11 supplying the bias $V_p$ and a second tongue 9 forming the oscillator outlet.

Within the cavity 10, which forms a 5×1 mm space and whose base is the earth plane, is arranged between the two tongues 9 and 11 a compact micro-module constituted by a capacitance pellet 5, to which are welded in juxtaposed manner a transistor pellet 1 and a varactor pellet 2.

As a result of the nature of the pellets, varactor 2 is in ohmic contact with the upper face of capacitor 5, said face constituting a first capacitor foil, while the lower face thereof is in ohmic contact with the box base constituting the earth. However, in view of the frequency band, transistor 1 is made from III-V materials, such as GaAs, its substrate is semi-insulating and the base of the transistor pellet is insulated from the capacitor pellet 5.

The dimensions of the pellet of the capacitor 5 are larger than those of the two juxtaposed pellets of transistor 1 and varactor 2. This makes it possible to thermally compress on the upper face of the pellet of capacitor 5 a metal wire which, connected to tongue 11, supplies the bias $V_p$.

The source, gate and drain metallizations of the transistor are visible, so that a metal wire is thermally compressed onto the drain and onto the outlet tongue 9, the length of said wire not being critical. Another metal wire is thermally compressed onto the gate and onto the base of the case at earth. It forms the choke 4 and its length is 2 mm for 2 nH in the case of a diameter 18 μm, inductance 1 nH/mm gold wire.

A second metal wire is thermally compressed between the source (or the sources if the transistor is interdigitated) of transistor 1 and varactor 2. As the two pellets of the transistor and the varactor are juxtaposed, the length L of said wire, which forms the sensitive point of the oscillator, is reduced to the minimum and namely a fraction of a millimeter. As a result of this minimum wire length L, the oscillator has a linear response in a band which is three times wider than in the known oscillators.

The self-biasing circuit of transistor 1 is fixed to the box base alongside the micromodule. It is formed by a capacitor pellet 6 and a resistor pellet 7 connected by a thermally compressed wire 8. As in the case of the micromodule, pellets 6 and 7 are in ohmic contact with the box and are consequently connected to earth. The position of the resistor pellet 7 and the length of the connection wire 8 are of no importance with respect to the oscillator frequency. However, the position of the capacitor pellet 6 is significant, because it regulates the length of the connecting wire between varactor 2 and capacitor 6 and this length constitutes the choke 3, which has a value 1 nH or 1 mm. The distance between capacitor 6 and varactor 2 increases the reactance and reduces the frequency of the oscillator and vice versa.

In FIG. 3, the transistor—varactor—capacitor micromodule is longitudinally fixed with respect to the case. It is transversely fixed in FIG. 4, which inter alia makes it possible to shorten the outlet connection 9. More generally, if the oscillator is produced in a differently shaped box, it is important for varactor 2 to be integrated within the box, together with the self-biasing circuit, which makes it possible to reduce to the minimum the transistor source—varactor length L, so as to have a broad linear response band and to regulate the choke 3 between the varactor and the self-biasing circuit, which makes it possible to regulate the centre oscillating frequency.

Figure 5:
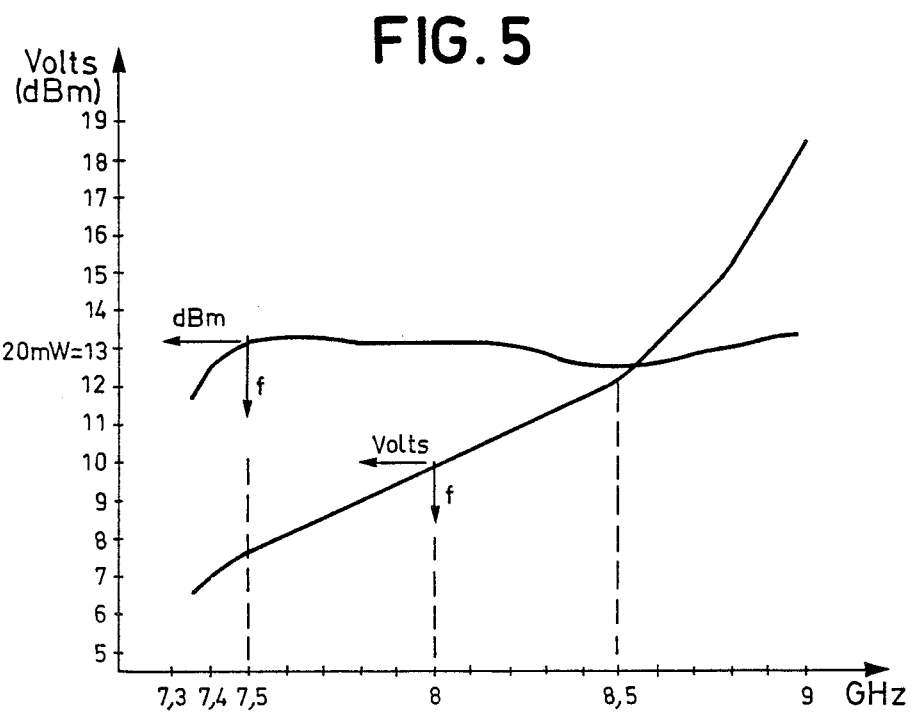
FIG. 5 shows characteristic curves of the oscillator according to the invention applying to the frequency as a function of the control voltage and the power as a function of the frequency.

FIG. 5 shows the frequency response curve of the oscillator according to the invention, as a function of the control voltage $V_p$, as well as the power curve as a function of the frequency. These curves show the perfect frequency linearity between 7.5 and 8.5 GHz for a control voltage varying between 7.5 and 12 V, as well as a good power linearity at 20 mW, i.e. 13 dBm±0.3 dBm in the same frequency band.

Obviously, the oscillator according to the invention, which has been described on the basis of an X band oscillator using a GaAs transistor and a rectangular case, can be produced in other ultra-high frequency box models, for other frequency bands and with components made from different materials and with different reactance and capacitance values.

What is claimed is:

1. A transistorized ultra-high frequency oscillator controlled by a variable capacitor of the varactor type, having a field effect transistor, whose gate is earthed through a choke and whose source is connected to a tuning circuit constituted by a varactor in parallel with a tuning choke, the oscillating circuit also having a first capacitor, connected between the varactor and earth in order to insulate from earth the control voltage applied to the varactor and, connected between the tuning choke and earth, a self-biasing circuit formed by a resistor balanced by a second capacitor, wherein the transistor, the varactor and the first capacitor are integrated into the same ultra-high frequency case in the form of a micromodule, the pellet of the transistor and the pellet of the varactor being fixed in juxtaposed manner to the pellet of the first capacitor.

2. An oscillator according to claim 1, wherein the control voltage of the varactor is also the bias of the transistor source, the self-biasing circuit being integrated into the same box as the micromodule.

3. An oscillator according to claim 1 wherein the connection length between the varactor and the transistor source is at a minimum, the frequency band width being maximum and linear as a function of the control voltage.

4. An oscillator according to claim 1, wherein the connection length between the varactor and the second capacitor regulates the centre frequency of the oscillator by regulating the inductance of the tuning choke.

* * * * *